(12) United States Patent
Haley (10) Patent No.: US 9,703,665 B1
(45) Date of Patent: Jul. 11, 2017

(54) DATA CENTER DESIGN PROCESS AND SYSTEM

(75) Inventor: David Bruce Haley, Dallas, TX (US)

(73) Assignee: Acuity Holdings, Inc., Addison, TX (US)

(*) Notice: Subject to any disclaimer, the term of this patent is extended or adjusted under 35 U.S.C. 154(b) by 1586 days.

(21) Appl. No.: 13/031,118

(22) Filed: Feb. 18, 2011

Related U.S. Application Data (60) Provisional application No. 61/306,055, filed on Feb. 19, 2010.

(51) Int. Cl.
*G06F 11/34* (2006.01)
*G06F 17/50* (2006.01)
*H05K 7/20* (2006.01)

(52) U.S. Cl.
CPC .......... *G06F 11/3442* (2013.01); *G06F 17/50* (2013.01); *G06F 17/5004* (2013.01); *H05K 7/20* (2013.01)

(58) Field of Classification Search
CPC .. G06F 17/5004; G06F 17/50; G06F 11/3442; H05K 7/20; G06Q 10/067
See application file for complete search history.

(56) References Cited

U.S. PATENT DOCUMENTS

| | | | | |
|---|---|---|---|---|
| 7,020,586 B2 * | 3/2006 | Snevely | | 703/1 |
| 7,065,637 B1 * | 6/2006 | Nanja | | 713/1 |
| 7,082,521 B1 * | 7/2006 | Nanja | | 713/1 |
| 7,313,503 B2 * | 12/2007 | Nakagawa et al. | | 703/1 |
| 7,418,608 B2 * | 8/2008 | Kumar et al. | | 713/320 |
| 7,472,043 B1 * | 12/2008 | Low et al. | | 703/1 |
| 7,596,476 B2 * | 9/2009 | Rasmussen et al. | | 703/2 |
| 7,962,789 B2 * | 6/2011 | Sampige et al. | | 714/26 |
| 8,131,515 B2 * | 3/2012 | Sharma et al. | | 703/1 |
| 8,179,809 B1 * | 5/2012 | Eppstein et al. | | 370/252 |
| 8,406,128 B1 * | 3/2013 | Brar et al. | | 370/229 |
| 8,417,578 B1 * | 4/2013 | Evans | | 705/26.1 |
| 8,447,569 B1 * | 5/2013 | Marwah et al. | | 702/186 |
| 8,601,287 B1 * | 12/2013 | Weber et al. | | 713/300 |
| 8,630,822 B2 * | 1/2014 | Karrat | | 703/1 |
| 2002/0124022 A1 * | 9/2002 | Yoo | | 707/513 |
| 2003/0115024 A1 * | 6/2003 | Snevely | | 703/1 |

(Continued)

OTHER PUBLICATIONS

Sustainable Data Centers: Enabled by Supply and Demand Side Management; Prith Banerjee et al; (ACM) DAC'09, Jul. 26-31, 2009; pp. 884-887.*

(Continued)

*Primary Examiner* — Akash Saxena
(74) *Attorney, Agent, or Firm* — Kirby B. Drake; Klemchuk LLP (57) ABSTRACT

The present disclosure generally provides a design system and process to improve the traditional ways of determining the requirements for, and estimated costs of, building a new data center from the ground up or retrofitting an existing facility. The design system and process automates the conceptual design phase for a data center facility. Requirements associated with a proposed data facility may be determined based on current and future needs of an organization, and from those requirements, various feasibility and financial scenarios may be explored. This system and design more easily enable users to evaluate the feasibility, complexity, as well as cost of the proposed data center design.

15 Claims, 2 Drawing Sheets

(56) References Cited

U.S. PATENT DOCUMENTS

| | | | |
|---|---|---|---|
| 2003/0158718 A1* | 8/2003 | Nakagawa et al. | 703/13 |
| 2003/0172145 A1* | 9/2003 | Nguyen | 709/223 |
| 2006/0020628 A1* | 1/2006 | Huberman et al. | 707/104.1 |
| 2007/0038414 A1* | 2/2007 | Rasmussen et al. | 703/1 |
| 2007/0078635 A1* | 4/2007 | Rasmussen et al. | 703/1 |
| 2008/0155441 A1* | 6/2008 | Long et al. | 715/771 |
| 2009/0138313 A1* | 5/2009 | Morgan et al. | 705/8 |
| 2009/0201293 A1* | 8/2009 | Tung et al. | 345/440 |
| 2009/0210781 A1* | 8/2009 | Hagerott et al. | 715/234 |
| 2010/0106464 A1* | 4/2010 | Hlasny et al. | 703/1 |
| 2010/0107171 A1* | 4/2010 | Amsterdam et al. | 718/104 |
| 2010/0286955 A1* | 11/2010 | VanGilder et al. | 702/182 |
| 2010/0292976 A1* | 11/2010 | Newcombe et al. | 703/13 |
| 2011/0106501 A1* | 5/2011 | Christian et al. | 703/1 |
| 2011/0239013 A1* | 9/2011 | Muller | 713/320 |
| 2011/0307820 A1* | 12/2011 | Rasmussen et al. | 715/771 |
| 2012/0041569 A1* | 2/2012 | Zhang et al. | 700/17 |
| 2012/0109619 A1* | 5/2012 | Gmach et al. | 703/21 |
| 2012/0209573 A1* | 8/2012 | Karrat | 703/1 |
| 2013/0317787 A1* | 11/2013 | Karrat | 703/1 |

OTHER PUBLICATIONS

Virtualization-based autonomic resource management for multi-tier Web applications in shared data center; Xiaoying Wang et al; The Journal of Systems and Software 81 (2008) pp. 1591-1608.*

* cited by examiner

DATA CENTER DESIGN PROCESS AND SYSTEM

CROSS REFERENCE TO RELATED APPLICATIONS

This application claims the benefit of Provisional Application No. 61/306,055, entitled "Design Tool for Data Centers," which is incorporated herein by reference in its entirety.

FIELD OF THE INVENTION

The disclosure relates generally to a data center design process and system, and more particularly, a design process and system for data center conceptualization and development.

BACKGROUND

Entities of all sizes are increasingly becoming more reliant on data center facilities in order to carry out, and preserve information regarding, their everyday core missions and activities. More and faster computing requires more and faster servers, storage, and other active hardware devices. This, in turn, requires that the data center facilities be bigger and/or denser. This often requires renovation of existing physical plant facilities or construction of entirely new physical plant facilities.

Various problems arise in addressing the demand for bigger and/or denser data centers: cost, deployment time, and technology innovation. Data center facilities often can cost in excess of ten to twenty times the cost of other real estate facilities, such as typical office spaces. This in turn may demand a significant financial commitment and investment, often involving substantial risks if the planning for such renovation or new construction happens to be done poorly. The data center lifecycle is getting shorter, often 5 years or less. There is often a significant lag time between planning a data center and actually going online. It often may take around one year to construct a data center in a pre-existing facility, and building a new facility from the ground up usually takes much longer. Further, the technology planned for in the design phase may be on the verge of being obsolete even before the data center facility becomes fully operational. Data centers also are often deficient in power, cooling, and capacity.

SUMMARY

Embodiments of the present disclosure generally provide a data center design process, the process comprising inputting at least one user-input value associated with the data center, entering information associated with at least two categories from which calculations in the data center design process can be derived, selecting a tier upon which to base the data center design, assessing and reviewing cost and design calculations, and receiving one or more reports associated with a proposed data center design.

The at least one user-input value may be selected from the group comprising number of staff members for the data center, the zip code where the data center will be located, the closest city where the data center will be located, the estimated kilowatt cost per hour, the type of facility, and the total estimated budget for the data center design. The data center design process also may include sliding scale ranges for the at least one user-input value from which said user can select. These sliding scale ranges further include color-coding that indicates generally acceptable ranges for each of the at least one user-input values.

The at least two categories may be selected from the group comprising dimensions of white space, maximum kilowatt per cabinet, maximum watts per square foot, cooling, and number of total servers. There may be sliding scale ranges for the at least two categories from which the user can select.

The process also may include identifying the number of years for desired growth of the data center. The process may further include receiving budget versus estimated comparisons on a tier-by-tier basis and/or receiving a summary comparing the user-input values with calculated values. The summary may comprise one or more of the following: staff members, zip code, facility type, total power at build-out, maximum watts per square foot, total white space square footage, maximum kilowatt hours per cabinet, cooling required, total servers, growth rate, and number of cabinets.

According to another embodiment of the present disclosure, a data center design system may comprise at least one server running a web server, a hypertext preprocessor, a relational database management system, and a user interface, wherein the system is accessed online using a web browser. The user may be a dynamic HTML page having code at the browser level to provide animations and to send user input to the at least one server for processing. Requests from the web browser may be processed using a server-side script. Results from server-side script processing may be displayed to a user. The user display also may comprise means for the user to export the results out of the data center design system. The system also may comprise a module that evaluates and optimizes the existing condition of a data center. The system may further include a tool that provides a visual representation of the data center design that may be manipulated by a user.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiment disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Developing a design for a data center facility often involves a maze of decisions. Questions arise as to whether to retrofit an existing facility or build a new facility. Issues may be raised with respect to co-location, power, cooling, capacity, growth, energy efficiency, and of course, cost. Embodiments of the present disclosure simplify this maze of decisions through an online web application that can assist in the data center design, development, and budgeting processes.

Embodiments of the present disclosure generally provide a design system and process to improve the traditional ways of determining the requirements for, and estimated costs of, building a new data center from the ground up or retrofitting an existing facility. The design system and process according to embodiments of the present disclosure automates the conceptual design phase for a data center facility. Requirements associated with a proposed data facility may be determined based on current and future needs of an organization, and from those requirements, various feasibility and financial scenarios may be explored. Embodiments of the present disclosure more easily enable users to evaluate the feasibility, complexity, as well as cost of the proposed data center design. Such a design system and process encourages collaboration to ensure that everyone on the design team may be more likely to be in agreement about the design plan, and team members may be more likely to be convinced that the basis of their design will support their business objectives considering acceptable requirements, risk, cost, effort, and time.

According to embodiments of the present disclosure, assessments of currently existing data center facilities may be made to identify limitations of the data center facility. Assessments also may be made to assist in new construction of a data center facility to develop and evaluate any programming design specifications, the estimated costs associated with the internal technology requirements, as well as the construction costs that may be required to house and support the technology that may be needed in the data center. Such an assessment by the design system and process according to embodiments of the present disclosure allows organizations to collaboratively drive the vision for their data center from the earliest stages and make more sound design decisions from a business and technology perspective. The assessment also may provide information to a user about the need for a new or updated data center facility, particularly given the rapidly changing nature of technology, and how fast technology, power, cooling, and/or capacity may be diminished or even obsoleted.

The present disclosure relates to an online web application for data center design that provides an intuitive user interface for end users having various levels of technical expertise relating to data centers. For example, executives as well as IT and facilities specialists often face diverse issues in the development, design and build-out of a data center. For example, executives may have issues related to the budgeting process taking too much time and delaying strategic and financial planning for the data center. On the other hand, facilities managers may need a tool to help them to find new ways to improve efficiency and automate manual processes, and perhaps do more with less. Further still, IT managers want to address issues, particularly justifying the need for funding a new data center. Each of these users may use the design system and process according to embodiments of the present disclosure, and this design system and process facilitate communication and collaboration among the various individuals involved in the design and development process.

The design system and process according to embodiments of the present disclosure provides a platform that provides real-time feasibility analysis of data center design concepts and allows the users to consider multiple data center design options. The design system and process preferably assists with creating benchmarks for a data center facility design that will propel the project into the next phases of detailed design, procurement, and construction. It also preferably provides detailed reports and estimates that may be shared with stakeholders. This information may be useful in project validation, to obtain funding, to bridge communication gaps, and also to avoid errors and oversights.

Figure 1:
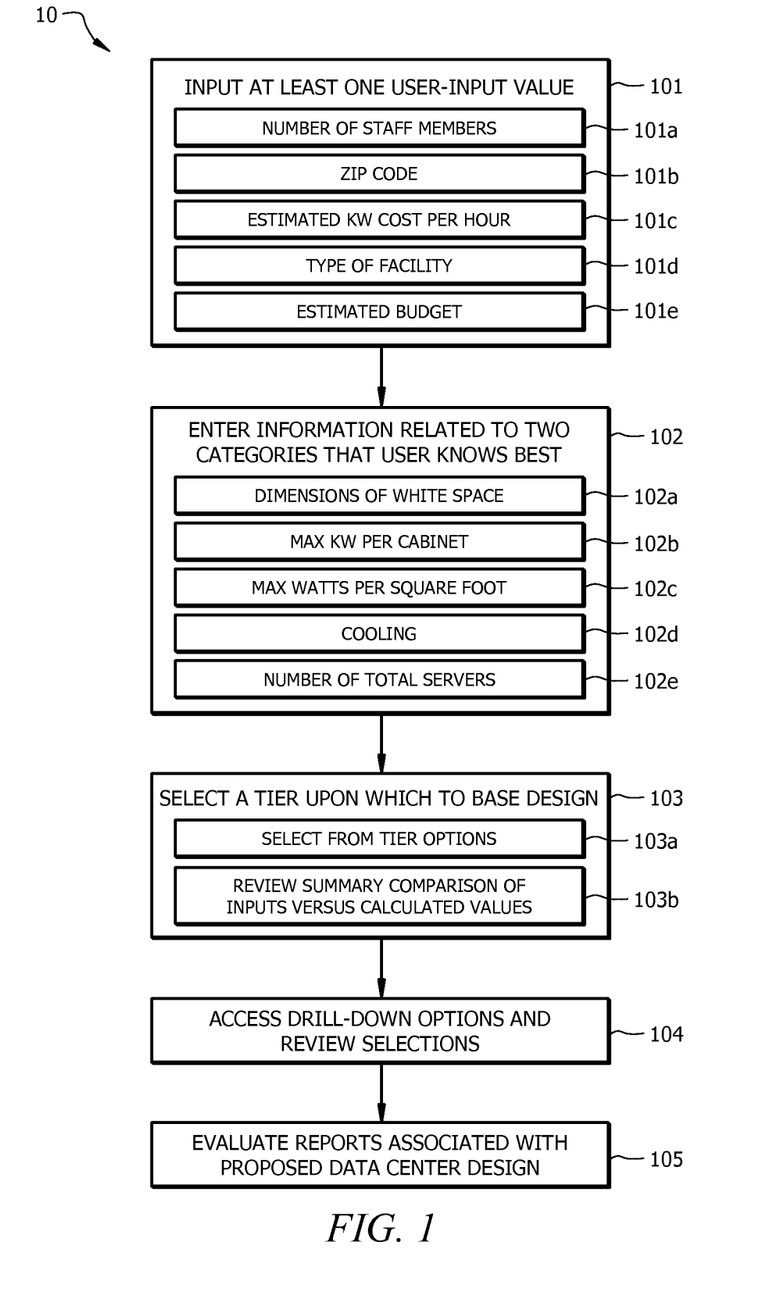
FIG. 1 depicts a flow chart of a design process using a system according to embodiments of the present disclosure.

Turning to FIG. 1, FIG. 1 depicts a flow chart of design process 10 using a data center design system according to an embodiment of the present disclosure. In step 101, one or more users may input various pieces of information including, but not necessarily limited to, the number of staff members that may need to be housed in the proposed data center (101*a*), the zip code or closest city to where the data center will likely be located (101*b*), the estimated kilowatt cost per hour for the data center (101*c*), the type of data center facility desired (i.e., new construction or retrofit) (101*d*), as well as a total estimated budget for the proposed data center (101*e*). It should be appreciated that while the above-identified pieces of information (101*a*-101*e*) may be input by one or more users according to an embodiment of the present disclosure, more or less information may be entered at step 101 of design process 10 without departing from the objects of the present disclosure.

When a user identifies the number of staff members expected to be housed in the data center in step 101*a*, it should be appreciated that staff members are considered to be full-time employees that are expected to office out of the data center facility. A user of the data center design system may select as few as 0 staff members if the data center is expected to be a "lights-out" facility. Step 101*a* may provide an acceptable range of staff members for a data center facility from which a user may select. Step 101*a* also may provide information about best practices for a typical data center facility. As an example, step 101*a* may provide that a user can select a number of staff members ranging from 0 to 24 by manipulating a sliding scale that may be depicted on the user interface of the web application. While such a sliding scale may permit a user to select a number as high as 24 in step 101*a*, the sliding scale may be associated with color-coding that suggests generally acceptable ranges of staff members to office in a proposed data center facility.

When a user inputs a zip code in step 101*b*, this information may be used to determine cost adjustments for materials and labor as compared to the national average. A user may, for example, enter a zip code to evaluate potential costs for a desired physical location where a new construction build-out is being proposed. The information entered in step 101*b* also may be used to compare, for example, potential design costs for a new build-out in one zip code to a retrofit of an existing facility in a different zip code.

In step 101*c*, a user may be provided a range of estimated kilowatt costs per hour options from which to select a value. As described above with respect to step 101*a*, a user may manipulate and select from a sliding scale of values with associated color-coding to indicate the generally acceptable ranges of values. However, a user may select a value that falls outside of the generally acceptable ranges but still be able to proceed through design process 10. If such a value is selected, the data center design system may notify or alert the user that the value falls outside of generally acceptable ranges and give a user the option to continue design process 10.

In step 101*d*, selecting "new construction" generally assumes a standard construction environment on land with typical preparation required for the foundation. Alternatively, selecting "retrofit" makes no assumptions as to the usability of the square footage that is entered.

In step 101*e*, a user may elect to enter a total estimated budget for the proposed data center construction. However, it should be appreciated that a user need not enter a budget in order to proceed with the remaining steps of design process 10.

Turning to step 102, a user is asked to select two categories that he/she knows the best from a series of approximately 5 categories of information that may be relevant to a proposed data center design. It does not matter which two categories any given user selects, as every calculation in design process 10 can be derived from knowing two pieces of the information that has been entered in step 102. According to an embodiment of the present disclosure, a user may select from the following categories: dimensions of white space (102*a*), maximum kilowatt per cabinet (102*b*), maximum Watts per Square Foot (102*c*), cooling (typically measured in tons) (102*d*), and number of total servers (102*e*). While certain categories have been identified in step 102, it should be appreciated that more or fewer categories may be incorporated into step 102 without departing from the objects of the present disclosure. Should a user have uncertainty as to what information is being requested in step 102*a*-102*e*, a user may hover his/her mouse or other pointing device over each category to receive an explanation and determine if he/she possesses the information relevant to the category.

In step 102*a*, a user may enter dimensions of white space for the proposed data center facility. It should be appreciated that square footage is only for white space that will contain cabinets, and the total square footage that will be calculated for a proposed data center facility should be considered in addition to the white space square footage that is entered. In step 102*a*, a user may optionally be provided with a sliding scale range from which to select to the square footage of white space that is desired. According to an embodiment of the present disclosure, the square footage options may range from approximately 1600 square feet (approximately 40 feet by 40 feet per hall) to 104,000 square feet (approximately 130 feet by 100 feet per hall). However, it should be appreciated that use of design process 10 is not necessarily limited to data center facilities having white space within this specified range. Data center facilities continue to grow in physical size as well as density, and it should be appreciated that design process 10, including the information to be entered in step 102, may be adapted to accommodate this expected growth.

The white space dimensions taken into consideration in step 102*a* generally are used to determine the maximum numbers of cabinets in the smallest footprint for all combinations of length and width that totals an equal square footage to that entered in step 102*a*. Design process 10 generally provides a user with a conceptual design that should help minimize or prevent airflow issues or "hot spots" in the proposed data center facility.

In step 102*b*, the maximum kilowatts per cabinet that may entered typically reflects an average of all cabinets to be included in the proposed data center facility. This will typically include core, network, as well as storage cabinets for the facility. In step 102*c*, the maximum watts per square foot generally may be calculated by taking into account only the white space square footage for the proposed data center facility.

In step 102*e*, various assumptions may be taken into account in estimating the number of servers to be included in a proposed data center facility. This number generally includes an organization's existing equipment (if it will be transferred and used in the new or retrofitted facility) as well as any planned future equipment. A user may be asked in step 102*e* to identify the type of server(s) to be included in the proposed data center facility as well as the percentage of each type of server that may be included in the facility. While presently a user may select from options including 1 U, 2 U, 4 U, and/or blade servers, it should be appreciated that the types of servers available for use in a data center facility are constantly changing. Design process 10, and particularly step 102*e*, may be modified to respond to these changes in server type without departing from the objects of the present disclosure.

In step 102*e*, a user may be asked to select the number of servers desired per hall in the proposed data center facility. A user may be provided with a maximum number of halls. According to an embodiment of the present disclosure, a user may be permitted to select up to 8 halls. However, it should be appreciated that as data center facilities increase in size, design process 10 may be modified to accommodate an increase in the number of halls in a given data center facility without departing from the objects of the present disclosure.

In step 102*e*, a user also may be asked to identify the number of years for desired growth associated with a proposed facility as well as a growth rate percentage. When a user enters a percentage of expected growth and/or time of growth, design process 10 assumes the same density and fill ratio as selected for the data center facility build-out. Design process 10 also may calculate white space square footage based on the maximum capacity of cabinets for the facility. This information may assist in identifying the maximum number of cabinets, servers, as well as watts per cabinet that may be accommodated in the facility accounting for expected growth over a certain period of time.

The user interface display that appears to a user in step 102*e* may provide the user with other information including the average wattage draw per server based on the number and type of servers that a user selects for a data center design. If a user elects to override these default average wattage draw numbers for any given type of server, a user has the ability to do so. A user also may be alerted, however, if the selected wattage is less than what the user may have input in step 102*b* or 102*a* or if the entered wattage results in an estimated kilowatt cost per hour that substantially differs from what the user may have input in step 101*c*. In response to such an alert, a user may decide to keep the entered value or change the value to remove any potential discrepancies with the initially input information.

In step 103, a user may be asked to select a tier upon which to base his/her data center design. A user may be asked to select one of several options (Tier I, II, III or IV) in step 103*a*. The tier classification for data centers generally relates to the availability (or mean time between failure) of the data center facility and may be associated with a level of redundancy within the proposed data center facility. More specifically, the tiers are generally based on several redundant factors including redundancy for power distribution and components, cooling distribution and components, utility services, as well as standby power (such as generators). The tiers also may be based on requirements for fire suppression, construction setbacks, and raised flooring. The tiers also may take into account consistent but uncontrollable environmental considerations such as, but not necessarily limited to, humidity levels and operating temperatures.

The tier calculations and descriptions are generally based on, but not limited to, requirements as published by industry standards bodies known to those of ordinary skill in the relevant art. The following tier levels and availability descriptions generally described with respect to step 103 are based, in part, on information from the Uptime Institute as well as experience of those having ordinary skill in the relevant art.

According to an embodiment of the present disclosure, Tier I may be considered the basic level facility. Such a facility may be susceptible to disruptions from both planned and unplanned activity. A Tier I system likely would have a single path for power and cooling distribution and no redundant components.

A Tier II system according to embodiments of the present disclosure may be less susceptible to disruptions from both planned and unplanned activity, in contrast to a Tier I system. A Tier II system typically includes a single path for power and cooling distribution, including redundant components (N+1), as well as a raised floor, UPS, and generator. In a Tier II system, maintenance of a power path and other parts of the infrastructure may require a processing shutdown.

A Tier III system according to embodiments of the present disclosure is considered to be concurrently maintainable in that it enables planned activity without disrupting computer hardware operation; however, unplanned events still may cause disruption. A Tier III system typically includes multiple power and cooling distribution paths but only one path is active at a time. It also typically includes redundant components (N+1). It may include raised floors and sufficient capacity distribution to carry a load on one path while performing maintenance on another path; however, maintenance of a power path and other parts of the infrastructure may still require a processing shutdown.

In a Tier IV system according to embodiments of the present disclosure, planned activity does not disrupt the critical load, and such a data center should be able to sustain at least one worst-case unplanned event with no critical load impact. A Tier IV system may be considered to be fault tolerant, and it typically includes active power and cooling distribution paths, as well as redundant components (2 (N+1); i.e., 2 UPS each with N+1 redundancy). A Tier IV system also may include raised floors and sufficient capacity distribution to carry a load on one path while performing maintenance on another path. However, like the Tier II and III systems described above, a Tier IV system requires a processing shutdown to perform maintenance of the power path and other parts of the infrastructure.

Step 103 also may provide the user with budget versus estimate comparisons on a tier by tier basis. As an example, if a user selects a Tier I system, step 103 may provide a comparison of the cost estimate for constructing such a system to the budget (if specified) for the proposed system. Further, to the extent that the estimates for any of the parameters input in steps 101-103 differ from what is calculated for the proposed system at issue in design process 10, a user may be provided with a summary comparing his/her inputs to the calculated values in step 103*b*. For example, if a user in step 101*c* inputs a value of 3 cents per kilowatt-hour, this value would be included in the summary comparison as the user's input value. The corresponding calculated value translates that estimated kilowatt cost per hour value into a dollar amount per month.

Other information that may be shown and/or modified in the summary comparison of step 103*b* may include staff members, zip code, facility type, total power at build-out, maximum watts per square foot, total white space square feet, maximum kilowatt hour per cabinet, cooling required (in tons), total servers, growth rate, and number of cabinets. It should be appreciated that the types of information and values included in the summary comparison of step 103*b* may vary without departing from the objects of the present disclosure. Further, it should be appreciated that construction costs and time to implement may vary greatly depending on the tier that may be selected in step 103*a*.

In step 104 of design process 10, an assessment of the drill down options may be made along with a review of the user's selections from steps 101 to 103. This evaluation generally provides estimated cost calculations for the proposed build-out of the proposed data center facility. A user may be given an estimated total cost for the build-out as well as a pie chart, or other graphical/visual representation, of the breakdown between estimated interior and exterior costs associated with the proposed build-out.

Interior costs that may be evaluated and/or modified in step 104 may include items such as, but not necessarily limited to, number and type of servers, cabinet infrastructure (such as cable topology), as well as network equipment utilized (such as number and type of routers, switches, and intrusion detection mechanisms). A user also may elect to modify the power choices and/or the redundancy of components within the proposed data center facility. Exterior costs may include construction of the facility itself as well as certain fixtures.

A user may manipulate this graphical/visual representation displayed in the user interface in step 104 to modify his/her selections associated with the interior and/or exterior that may alter the overall cost of the proposed build-out. For example, a user may elect to change his/her cooling selection by increasing or decreasing the size of the CRAC and/or the quantity of CRACs to be utilized in the proposed facility. It should be appreciated that a user may opt to design a Tier II facility but modify the cooling selection to be more in line with a Tier III facility (i.e., change the redundancy for the cooling component for the facility).

Accordingly, when a user modifies one or more components comprising the interior and/or exterior costs, the total cost associated with the proposed data facility build-out may be recalculated. This customization of the estimated costs allows a user to make changes to different components comprising the facility build-out and immediately begin to recognize the impact of each decision or modification that may be made. As an example, as discussed above, if a user increases the number of cooling components to be included in the proposed facility, the total build-out cost will likely increase. In response to such an increase in overall cost due to the increase in cooling components, a user may make modifications to other interior or exterior components in order to adjust the total build-out cost to comport with an organization's overall desired budget for the proposed build-out, for example.

In step 104, a user also may be provided with at least one visual representation of the layout of the proposed data center facility. This visual representation may provide a square footage breakdown of the facility relative to architecture standards. In an embodiment of the present disclosure, a user may be provided with a visual representation of the cabinet layout within the facility and how the halls may be structured.

In step 104, a user may be provided with an option to modify the total square footage for the site including the proposed data center (or the linear feet per side). A user also may be provided an option to modify the floor loading (i.e., pounds per square foot that the floor can support) and/or the deck-to-deck height of the facility (including the minimum room height).

In step 105, various reports may be provided to a user. These reports may provide cost estimations that permit a user to estimate the potential construction costs for a data center during the schematic design phase. These reports may assist a user to make preliminary design decisions for the basic framework and specifications for a data center project. The cost information typically included in the reports provided to a user in step 105 may be based on current U.S. cost indices and assumptions for standard data center construction types, quality and condition of inclusions. However, a user employing design process 10 should appreciate that there may be variances of approximately 15-40% expected in an early design phase before detailed design has been completed.

A system for performing design process 10 as depicted in FIG. 1 may run a single Linux server running a web server (such as an Apache Web Server), a server-side script, a relational database management system such as MySQL. The system also preferably uses a MySQL database. However, other similar servers, scripts, and/or databases may be utilized without departing from the objects of the present disclosure. For example, in an embodiment of the present disclosure, PHP hypertext preprocessor (PHP) is a server-side script or scripting language used to develop tools used in the system. However, such tools may be developed in ASP.net or JSP or any other server-side scripting language without departing from the objects of the present disclosure. This system is preferably operated as a web-based application so that it may be accessed online using a web browser. Http sessions may be used to authenticate users and to store data corresponding to a user and project in a MySQL database. The user interface typically takes the form of a dynamic HTML page, using Javascript code at the browser level to provide animations and to send user input to the server for processing. At the server level, requests from the browser may be processed using a server-side script, such as PHP. The results may then be displayed to a user in HTML format while the user accesses the website. A user also may be presented with an option to export results to a PDF document or to receive raw data in CSV format that may be viewable in Excel or other spreadsheet-related software.

The results generated by a data center design system according to embodiments of the present disclosure may be a hybrid of programmatic logic and database lookup tables. At least some of the calculations that such a data center design system makes to arrive at its results may be mathematical formulas executed by the server-side script code using a combination of user inputs and constants that are either hard-coded into source code running the system or queried from the database associated with the system. Other calculations may be made by querying the database using one or more user's inputs or calculations derived from the user inputs.

In a further embodiment of the present disclosure, a module for evaluating and optimizing the existing condition of a data center may be incorporated into the system and design process described above with respect to FIG. 1. Alternatively, this module may be utilized as a tool to complement the system and design process of FIG. 1, and not necessarily integrated into the system and design process itself. This module may be considered a data center optimization efficiency tool to evaluate an existing data center facility and determine evaluate whether there is a need for modification of the data center facility. It also may assist in evaluating whether a new data center facility may be needed in order to improve efficiency and/or reduce cost to run such a facility.

This tool like the system running design process 10 may be a web-based application that can be accessed online via a web browser. This tool may be run on a single Linux server running a web server, a server-side script, and MySQL. Again, other similar servers and/or databases may be utilized without departing from the objects of the present disclosure. This tool typically uses http sessions to authenticate users, and it stores data corresponding to a user and a project, for example, in a MySQL database. The user interface for this tool may take the form a dynamic HTML page and may use Javascript code at the browser level to provide animations and send user input to a server for processing. At the server level, requests from the browser may be processed using a server-side script. The results may then be displayed to a user in HTML format through his/her web browser.

Information that may be input for evaluation by this module according to embodiments of the present disclosure may include, but is not necessarily limited to, white space dimensions, deck-to-deck height (typically measured in feet), raised floor height (typically measured in inches), drop ceiling height (typically measured in inches), floor loading (typically represented in pounds per square foot), maximum cooling available (typically measured in tons), maximum power available (typically measured in kVa), UPS utilization (measured from 1-100%), and load phase. It should be appreciated that the units may be converted to metric or other conversion units if needed without departing from the objects of the present disclosure. The user also may be asked to identify the tier level associated with the current facility. It should be appreciated that the values input for evaluation may include more or fewer values than those discussed above without departing from the objects of the present disclosure.

As discussed above with respect to certain steps described in FIG. 1, a user may change these parameters reflecting a facility's current limitations using a sliding scale input tool associated with each parameter. Additionally or alternatively, a user may be asked to input a value in connection with each parameter. For example, when a user is asked to enter dimensions of white space, a user may enter a value representing the hall square footage. In another embodiment of the present disclosure, a user may elect to create a drawing of the white space, for example, by clicking, holding and dragging the corners of a box within a drawing tool to select the length and width of the white space associated with the current facility. The calculations and results generated using this tool are typically generated programmatically.

Once these parameters have been entered into the data center optimization efficiency tool, a visual representation or model of the facility may be displayed to a user. A server-side script application may create a virtual model of a data center stored in memory on the server. This model is generated using the inputs provided by a user through the web-based user interface. Elements are plotted in the virtual data center model. Using that model, additional calculations may be derived. The model may then be used to render an image showing the virtual model layout. As calculations are modified, the results are sent to a user's web browser and updated on the web page in real-time, preferably using Javascript.

This visual representation may include the placement of cooling units (also known as CRACs) and may assist a user in understanding how the current facility may be optimized to make better use of the white space, for example. A user may further manipulate this visual representation or model in terms of changing additional variables. Some of these additional variables may include, but are not necessarily limited to, kilowatts per cabinet, the maximum number of cabinets, cabinet orientation in relation to the length of the room (i.e., whether the cabinets are horizontal or vertical), the cabinet dimensions (i.e., width and depth), the CRAC configuration in relation to the cabinet rows (i.e., whether the CRACs are parallel or perpendicular), the CRAC size, linear feet for the hot and cold aisles, linear feet for column spacing structural support, and whether there is a ramp in the room.

A user may be provided with information about the cubic feet of air return currently available in the facility, and a user may be permitted to alter that value to evaluate what air return value might be needed for the facility. Similarly, a user may be able to view the current air supply available in the facility and define what air support might be desired or appropriate for the facility. A user also may be able to view the user-defined limitations on the same display with the visual representation of the facility.

As discussed above with respect to the data center optimization efficiency tool, the data center design process and system according to embodiments of the present disclosure also may include a drawing tool or module that further enables a user to populate the data center facility design incorporating any desired engineering features identified during the design process. For example, a user may elect to change the number of cabinets, and this tool or module provides the user with a visual representation or model of his/her current data center facility incorporating changes to or optimizing certain features of the facility. Additionally or alternatively, the drawing tool or module may provide a user with information concerning the proposed data center facility.

Figure 2:
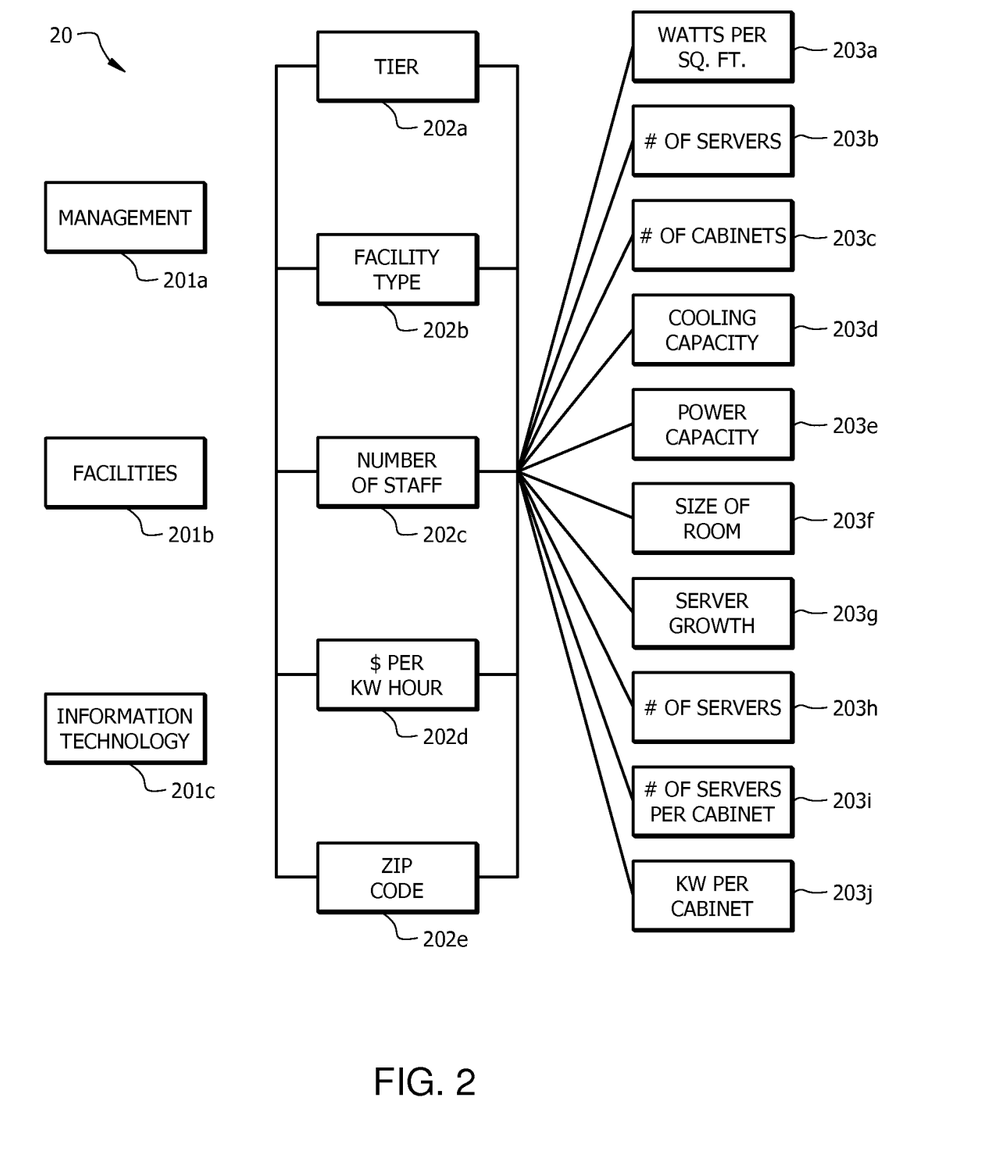
FIG. 2 depicts a data center design system according to embodiments of the present disclosure.

Turning to FIG. 2, FIG. 2 depicts data center design information that may be provided by management 201a, facilities 201b, and/or information technology 201c and how this information may be evaluated in the design process according to embodiments of the present disclosure. Information that may be input by management 201a, facilities 201b, and/or information technology 201c may include, but is not necessarily limited to, tier identification 202a, facility type 202b, number of staff 202c, dollars per kilowatt hour 202d, and zip code 202e. It should be appreciated that any of information 202a-202e may be provided by one or more of management 201a, facilities 201b, and/or information technology 201c without departing from the objects of the present disclosure.

Using one or more of information 202a-202e in conjunction with standard engineering and architectural principles and factors, design system 20 may evaluate several variables in conjunction with input from user 201a, 201b and/or 201c. These variables may include, but are not necessarily limited to, watts per square foot 203a, number of servers 203b, number of cabinets 203c, cooling capacity 203d, power capacity 203e, size of room 203f, server growth 203g, number of servers 203h, number of servers per cabinet 203i, and kilowatts per cabinet 203j.

Upon processing variables 203a-203j that are derived, in whole or in part, from information 202a-202e, various design requirements 203a-203j may be output to a user for further evaluation and processing by design system 20 according to embodiments of the present disclosure.

For example, an evaluation of deck-to-deck values that may be needed for a proposed data center facility may be made using all or some of variables 203a-203j. The deck-to-deck values may then drive the floor height, ceiling height, ceiling to deck height, and floor loading values that may be preferable for a given facility. The floor and ceiling height may in turn drive the floor and ceiling type, respectively. The ceiling-to-deck height also may drive the ceiling type that may be optimal for the facility. Any floor loading information may drive the type of structural reinforcement that may be needed in the proposed data center facility.

In another example, utilizing information concerning, for example, server growth 203g, number of servers 203h, number of servers per cabinet 203i and kilowatts per cabinet 203j, design system 20 may evaluate the number of network cabinets, the number of network racks, and the number of server cabinets that may be needed in proposed data center facility. Similarly, using information 203g-203j, design system 20 may evaluate the cabling needed per cabinet, addressing variations in cost with respect to copper, fiber and/or SAN fiber cabling, for example. Further, using information 203g-203j, design system 20 may evaluate changes in cost and/or structure associated with the proposed data center facility depending on the type of technology to be utilized in the data center facility. Technology types may include, but are not necessarily limited to, distributed local area network (LAN), consolidated LAN, firewall-IDS-VPN-routers, access control, security cameras, wireless, phone system, printers/scanners/fax/MFDs, swing servers, operating systems, and/or audio visual.

Further, utilizing information provided by user 201a, 201b and/or 201c regarding the type of facility, design system 20 may, in conjunction with user input and evaluation, assist in making an evaluation as to the building parameters and setbacks that might be needed in a proposed data center facility preliminary design. Building parameters may include, but are not limited to, number and size of windows, square feet of mechanical space(s), staging areas, and lobby needed, number and square feet of loading dock(s), break room(s), bathroom(s), conference room(s), and office(s) needed, sidewalks and parking spaces needed, as well as total square feet of acreage needed.

Accordingly, the system and design process according to embodiments of the present disclosure permit a user to assess current data center limitations, plan for space, power, cooling, capacity and growth, as well as provide context for solutions and estimate costs associated with a potential data center design and build-out. The system and design process preferably permit users with varying levels of expertise to run through various design scenarios for a proposed data center, and thus, the system and design process according to embodiments of the present disclosure merge functionality from the IT, facilities, as well as executive perspectives.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The invention claimed is:

1. A data center design process, said process comprising:
inputting at least one user-input value associated with said data center;
entering information associated with at least two user-selected categories from which calculations in said data center design process can be derived, the at least two user-selected categories selected from the group comprising dimensions of white space, maximum kilowatt per cabinet, maximum watts per square foot, cooling, and number of total servers;
selecting a tier upon which to base said data center design, said tier selected from the group comprising: Tier I, Tier II, Tier III, and Tier IV;
assessing and reviewing cost and design calculations generated by processing said at least one user-input value, information associated with said at least two user-selected categories and said tier selection; and
receiving one or more reports associated with a proposed data center design.

2. The data center design process of claim 1, said at least one user-input value selected from the group comprising:
number of staff members for said data center, the zip code where said data center will be located, the closest city where said data center will be located, the estimated kilowatt cost per hour, the type of facility, and the total estimated budget for said data center design.

3. The data center design process of claim 2, wherein said data center design process includes sliding scale ranges for said at least one user-input value from which said user can select.

4. The data center design process of claim 3, wherein said sliding scale ranges further include color-coding that indicates generally acceptable ranges for each of said at least one user-input value.

5. The data center design process of claim 2, wherein the type of facility may be new construction or retrofit of an existing facility.

6. The data center design process of claim 1, wherein said data center design process includes sliding scale ranges for said at least two user-selected categories from which said user can select.

7. The data center design process of claim 1, wherein said number of total servers includes existing equipment and any planned future equipment.

8. The data center design process of claim 1, said process further comprising:
identifying number of years for desired growth of said data center.

9. The data center design process of claim 1, said selecting step further comprising:
receiving budget versus estimated comparisons on a tier-by-tier basis.

10. The data center design process of claim 1, said selecting step further comprising:
receiving a summary comparing said user-input values with calculated values.

11. The data center design process of claim 10, said summary further comprising one or more of the following:
staff members, zip code, facility type, total power at build-out, maximum watts per square foot, total white space square footage, maximum kilowatt hours per cabinet, cooling required, total servers, growth rate, and number of cabinets.

12. A method for online data center design assessment comprising:
inputting the number of staff members to reside in the data center;
selecting two categories from the group comprising dimensions of white space, maximum kilowatt per cabinet, maximum watts per square foot, cooling, and number of total servers, wherein when the two selected categories are maximum kilowatts per cabinet and maximum watts per square foot;
receiving an alert if estimated equipment or growth associated with the two categories exceeds capacity for the data center design, wherein the alert is that the maximum kilowatts per cabinet results in an estimated kilowatt cost per hour that differs from the maximum watts per square foot;
selecting a tier upon which to base the data center design;
reviewing cost and design calculations generated by processing the number of staff members, the two selected categories, and the tier selection; and
receiving one or more reports providing cost estimations for the data center design,
wherein the steps are performed online using a web browser.

13. The method of claim 12 further comprising:
receiving one or more suggested modifications to stay within the capacity for the data center design upon receiving the alert if estimated equipment or growth exceeds capacity for data center design.

14. The method of claim 12 further comprising:
receiving a notification that the two categories result in more than one data center design option.

15. The method of claim 12 further comprising:
in selecting the tier, receiving budget versus estimate comparisons on a tier-by-tier basis.

* * * * *